United States Patent [19]
Nakanishi

[11] Patent Number: 5,895,971
[45] Date of Patent: Apr. 20, 1999

[54] SEMICONDUCTOR DEVICE WITH ELECTRICAL CONNECTION BETWEEN SEMICONDUCTOR CHIP AND SUBSTRATE LESS BREAKABLE DURING SHRINKAGE OF ADHESIVE COMPOUND

[75] Inventor: Futoshi Nakanishi, Tokyo, Japan

[73] Assignee: NEC Corporation, Tokyo, Japan

[21] Appl. No.: 08/813,032

[22] Filed: Mar. 6, 1997

[30] Foreign Application Priority Data

Mar. 8, 1996 [JP] Japan .................. 8-51614

[51] Int. Cl.$^6$ ........................... H01L 23/053
[52] U.S. Cl. ................ 257/701; 257/712; 257/783; 257/778; 257/796
[58] Field of Search ............ 257/783, 793, 257/778, 701, 787, 712, 713, 796

[56] References Cited

U.S. PATENT DOCUMENTS 5,461,197  10/1995  Hiruta et al. ................. 257/778
5,627,407  5/1997  Suhir et al. .................. 257/701
5,641,996  6/1997  Omoya et al. ................ 257/787
5,646,204  7/1997  Akiba et al. ................. 257/793

FOREIGN PATENT DOCUMENTS

2-28946  1/1990  Japan .
5-235063  9/1993  Japan .

*Primary Examiner*—Peter Toby Brown
*Assistant Examiner*—Roy Potter
*Attorney, Agent, or Firm*—Sughrue, Mion, Zinn, Macpeak & Seas, PLLC

[57] ABSTRACT

An adhesive compound layer bonds the reverse surface of a semiconductor chip to a major surface of a substrate, and a restoring compound layer is formed on a top surface of the semiconductor chip; the adhesive compound layer and the restoring compound layer exert a first force on the reverse surface and a second force on the top surface due to shrinkage during a thermosetting so that a first moment due to the first force is reduced or canceled by a second moment due to the second force, thereby preventing the semiconductor chip from undesirable warp.

15 Claims, 8 Drawing Sheets

Fig. 6E

SEMICONDUCTOR DEVICE WITH ELECTRICAL CONNECTION BETWEEN SEMICONDUCTOR CHIP AND SUBSTRATE LESS BREAKABLE DURING SHRINKAGE OF ADHESIVE COMPOUND

FIELD OF THE INVENTION

This invention relates to an assembling technology for a semiconductor device and, more particularly, to a semiconductor device with an electrical connection between a semiconductor chip.

DESCRIPTION OF THE RELATED ART

Figure 1:
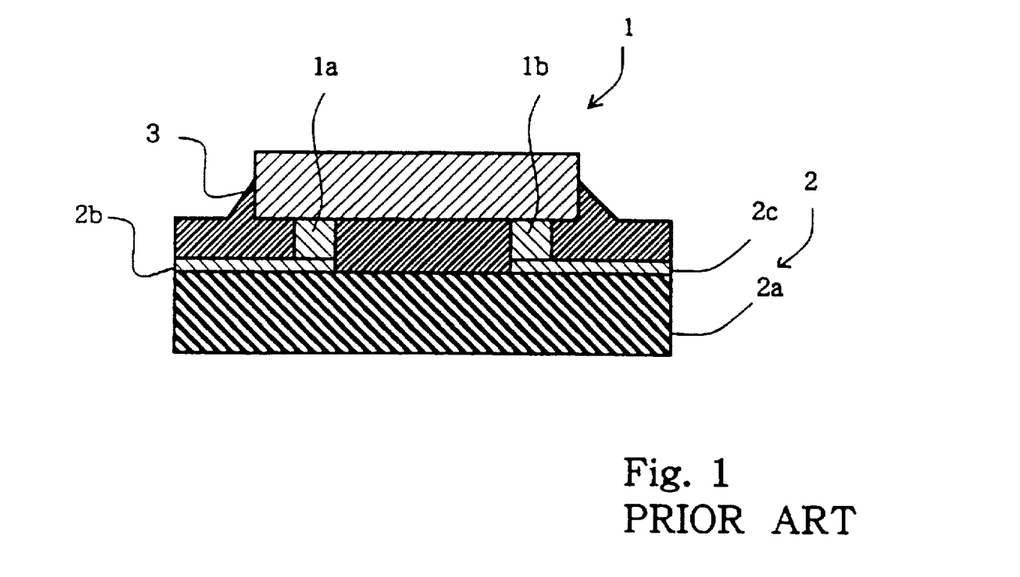
FIG. 1 is a cross sectional view showing the structure of the prior art semiconductor device.

Various assembling technologies are used for a semiconductor device. A typical example of the assembling technologies is known as a face-down bonding, and is disclosed in Japanese Patent Publication of Unexamined Application (JPA) No. 2-28946, and FIG. 1 illustrates the structure of a semiconductor device fabricated through the prior art process. Reference numeral 1 designates a semiconductor chip where electric circuit components are integrated. A plurality of connecting electrodes 1a and 1b project from the reverse surface of the semiconductor chip 1.

The semiconductor chip 1 is mounted on a insulating substrate 2. The insulating substrate 2 comprises an insulating plate 2a formed of glass or ceramic and conductive wirings 2b and 2c printed on the major surface of the insulating plate 2a. The conductive wirings 2b/2c are formed of indium-tin-oxide, chromium, aluminum or gold. The connecting electrodes 1a and 1b are aligned with the conductive wirings 2b/2c, and adhesive compound 3 bonds the semiconductor chip 1 to the printed circuit board 2. The adhesive compound 3 is photo-cured synthetic resin in epoxy system or acrylic system. Japanese Patent Publication of Unexamined Application No. 5-235063 proposes to use adhesive compound same as the synthetic resin used for sealing a semiconductor chip.

Figure 2A:
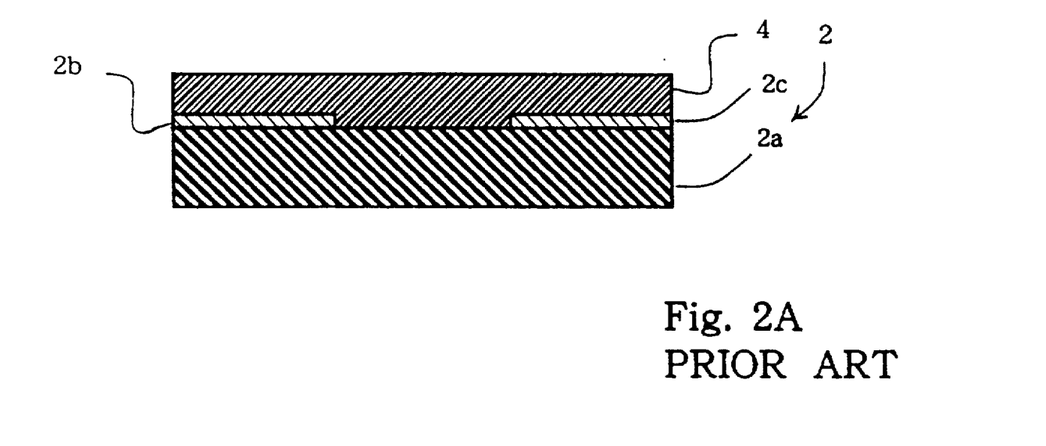
FIGS. 2A to 2C are cross sectional views showing the prior art process sequence for assembling the semiconductor device.
Figure 2B:
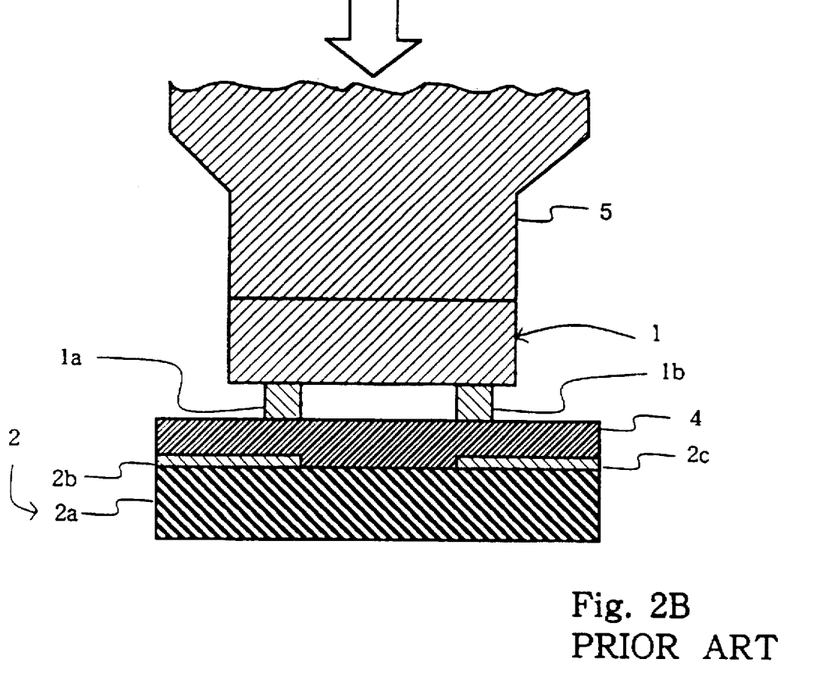
Figure 2C:
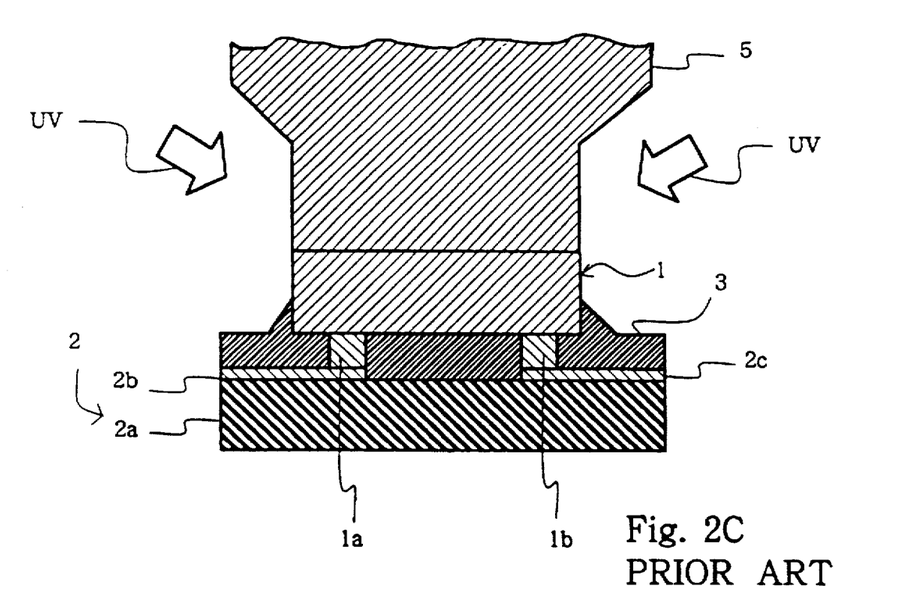

The prior art semiconductor device shown in FIG. 1 is fabricated through the following process sequence shown in FIGS. 2A to 2C. The prior art process sequence starts with preparation of the insulating substrate 2. The conductive wirings 2b/2c have been already printed on the major surface of the insulating plate 2a.

Unconsolidated adhesive compound is spread over the printed circuit board 2, and the conductive wirings 2b/2c and the major surface of the insulating plate 2a are coated with the unconsolidated adhesive compound layer 4 as shown in FIG. 2A.

Subsequently, the semiconductor chip 1 is placed on the unconsolidated adhesive compound layer 4, and the connecting terminals 1a/1b are aligned with the conductive wirings 2b/2c, respectively. A pressurizer 5 is downwardly moved toward the semiconductor chip 1, and is brought into contact with the upper surface of the semiconductor chip 1 as shown in FIG. 2B. The pressurizer 5 presses the semiconductor chip 1 against the unconsolidated adhesive compound layer 4, and the connecting terminals 1a/1b are sunk into the unconsolidated adhesive compound layer 4. The unconsolidated adhesive compound is pushed aside, and the connecting electrodes 1a/1b are brought into contact with the conductive wirings 2b/2c, respectively. The force exerted on the semiconductor chip 1 is large enough to deform the connecting electrodes 1a/1b so as to take up the difference in thickness between the connecting electrodes 1a/1b.

The pressurizer 5 decreases the force exerted on the semiconductor chip 1. For this reason, even though the force is exerted on the semiconductor chip 1 and the insulating substrate 2 for long time, the reduced force does not warp the semiconductor chip 1 and the insulating substrate 2.

Ultra-violet light UV is radiated to the unconsolidated adhesive resin 4, and the adhesive resin is photo cured through the radiation of the ultra-violet light UV as shown in FIG. 2C. The unconsolidated adhesive compound already pushed aside is consolidated along the side surfaces of the semiconductor chip 1. The photo-cured adhesive resin 3 bonds the semiconductor chip 1 to the insulating substrate 2, and the electric connection is established between the conductive wirings 2b/2c and the semiconductor chip 1. Finally, the pressurizer 5 is upwardly moved, and the semiconductor device 1 is released from the force.

The prior art semiconductor device encounters a problem in that the connecting electrodes 1a/1b tend to be separated from the conductive wirings 2b/2c.

The prior art process encounters a problem in a complex control for the pressurizer. Another problem is that the pressurizer 5 tends to break the semiconductor chip 1.

SUMMARY OF THE INVENTION

It is therefore an important object of the present invention to provide a semiconductor device connecting electrodes of which are hardly separated from conductive wirings on an insulating substrate.

It is also an important object of the present invention to provide a process of assembling a semiconductor chip with an insulating substrate which is simple and less liable to break the semiconductor chip.

The present inventor contemplated the problems of the prior art semiconductor device, and noticed that the adhesive compound was shrunk during the consolidation through the photo-curing. When the unconsolidated adhesive compound was photo cured, the adhesive compound was shrunk along the reverse surface of the semiconductor chip 1, and compressive force was exerted thereon. The present inventor concluded that the compressive force due to the shrinkage of the adhesive compound deformed the semiconductor chip 1 so as to separate the connecting electrodes 1a/1b from the conductive wirings 2b/2c.

To accomplish the object, the present invention proposes to cancel the compressive force exerted on the reverse surface of a semiconductor chip.

In accordance with the present invention, there is provided a semiconductor device comprising: a substrate including an insulating plate having a surface and at least one conductive wiring formed on the surface of the insulating plate; an electric circuit component having a first surface, a second surface opposite to the first surface and at least one electrode formed on the first surface and held in contact with the at least one conductive wiring; a consolidated adhesive compound provided between the first surface of the substrate and the first surface of the electric component so as to bond the electric circuit component to the substrate, and exerting a first force to the first surface of the electric circuit component due to a shrinkage during a consolidation; and a restoring compound layer provided on the second surface of the electric circuit component so as to exert a second force on the second surface of the electric component due to a shrinkage thereof, thereby reducing a moment due to the first force exerted on the first surface of the electric circuit component.

The adhesive compound and the compound for the restoring compound layer may be synthetic resin in the epoxy system.

The adhesive compound and the restoring compound layer may be equal in thickness.

The adhesive compound and the restoring compound layer may be consolidated through application of heat.

The semiconductor device may further comprise a heat sink for radiating heat generated by the electric circuit component.

The heat sink may be bonded by means of the restoring compound layer.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

Figure 3:
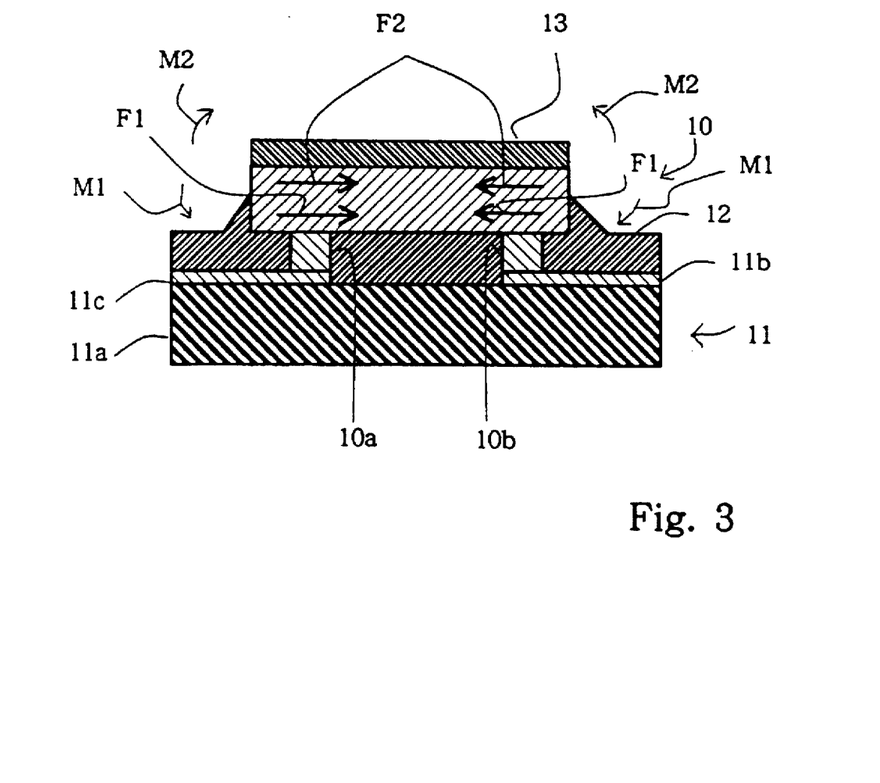
FIG. 3 is a cross sectional view showing the structure of a semiconductor device according to the present invention.

Referring to FIG. 3 of the drawings, a semiconductor device embodying the present invention comprises a semiconductor chip 10, a substrate 11, adhesive compound 12 and a restoring layer 13. Though not shown in the drawings, a plurality of circuit components are integrated in the semiconductor chip 10, and the integrated circuit is connected to electrodes 10a and 10b. The electrodes 10a and 10b are exposed to the reverse surface of the semiconductor chip 10, and project therefrom. The electrodes 10a and 10b are formed of gold, and, accordingly, are easily deformed. The electrodes 10a/10b are of the order of 20 microns thick before assemblage with the substrate 11, and are partially crushed during the assemblage so as to equalize the distance from a major surface of the substrate 11 opposed to the reverse surface. The decrement of the thickness is about 3 microns, and the reverse surface of the semiconductor chip 10 is spaced from the major surface of the substrate 11 by 17 microns. In this instance, the semiconductor chip 10 serves as an electric component.

The substrate 11 includes an insulating plate 11a and a plurality of conductive wirings 11b/11c patterned on the major surface of the insulating plate 11a. The electrodes 10a and 10b are aligned with the conductive wirings 11c/11b, and are held in contact therewith so that the conductive wirings 11b/11c propagate electric signals between the integrated circuit and another electric circuit component (not shown). The conductive wirings 11b/11c range 0.01 micron to 2 microns thick, and are formed of indium tin oxide, chromium, aluminum, gold or another conductive alloy.

The adhesive compound 12 fills the gap between the major surface of the substrate 11 and the reverse surface of the semiconductor chip 10, and swells into a side wall held in contact with lower portions of the side surfaces of the semiconductor chip 10. The adhesive compound 12 fixes the semiconductor chip 12 to the substrate 11. As described hereinbefore, the gap between the semiconductor chip 10 and the substrate 11 is about 17 microns, and the adhesive compound layer 12 is of the order of 17 microns thick. The adhesive compound 12 is thermosetting epoxy resin, and reduces the volume during a heat treatment. For this reason, the adhesive compound 12 exerts compressive force F1 to the semiconductor chip 10 along the reverse surface thereof.

The restoring layer 13 is regulated to 17 microns thick, and is formed of the thermosetting epoxy resin. For this reason, the thermosetting reduces the volume of the restoring layer 13, and the restoring layer 13 exerts compressive force F2 to the semiconductor chip 10 along the top surface thereof.

Although the compressive force F1 produces a moment M1 exerted on the semiconductor chip 10, and the moment M1 tries to warp the semiconductor chip 10. However, the force F2 produces a counter moment M2, and the counter moment M2 cancels the moment M1. When the counter moment is equal to the moment M1, no warp takes place. Even if the counter moment M2 is different in magnitude from the moment M1, the moment M1 is reduced, and the semiconductor chip 10 is not widely warped. Thus, the restoring compound layer 13 cancels or decreases the moment M1 exerted on the semiconductor chip 10, and the semiconductor chip 10 maintains the original configuration. This results in that the electrodes 10a/10b maintain the contact with the conductive layers 11c/11b.

Figure 4A:
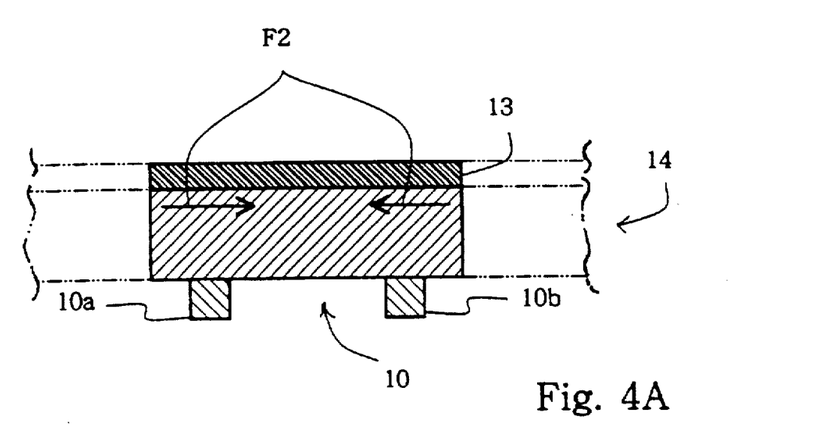
FIGS. 4A to 4D are cross sectional views showing a process sequence for assembling the semiconductor device according to the present invention.

Description is made on a process of assemblage of the semiconductor device with reference to FIGS. 4A to 4D. The process starts with preparation of a semiconductor wafer 14 containing the semiconductor chip 10. Unconsolidated epoxy resin is spun onto the semiconductor wafer 14, and the semiconductor chip 10 is coated with the unconsolidated epoxy resin. The unconsolidated epoxy resin is treated with heat, and is converted to the restoring compound layer 13. The epoxy resin has a glass transition temperature between 100 degrees and 150 degrees in centigrade. The epoxy resin is shrunk during the consolidation under the application of heat, and the force F2 is exerted on the upper surface of the semiconductor chip 10 as shown in FIG. 4A. The force F2 slightly warps the semiconductor chip 10.

Subsequently, the semiconductor wafer 14 is separated into the semiconductor chips 10 through a scribing and a wafer breaking, and one of the semiconductor chips 10 is mounted on the substrate 11.

The major surface of the substrate 11 is coated with unconsolidated adhesive epoxy resin 15. The unconsolidated adhesive epoxy resin is provided in the form of paste or foil. If the unconsolidated adhesive epoxy resin is given in the form of paste, the unconsolidated adhesive epoxy resin paste is spread over the major surface by using a dispenser or a printing technique. On the other hand, if the unconsolidated adhesive epoxy resin is given in the form of foil, the unconsolidated adhesive epoxy foil is adhered to the upper surface of the semiconductor chip 10 by using a stamp technique.

Figure 4B:
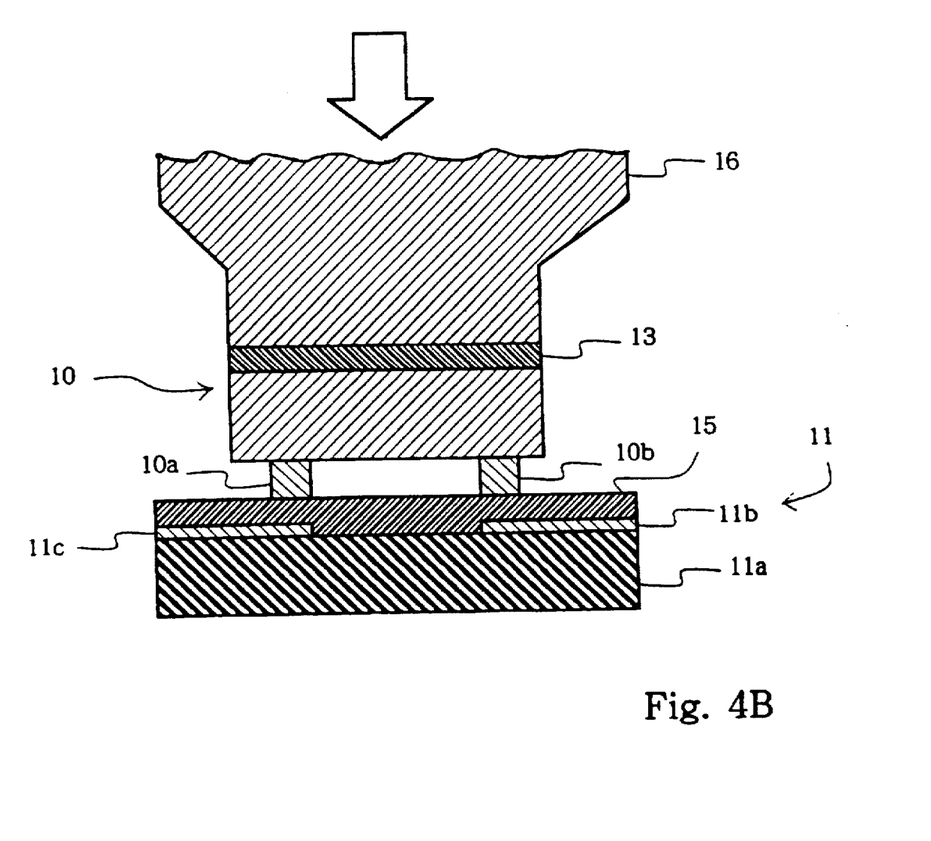

Subsequently, the semiconductor chip 10 is moved onto the unconsolidated adhesive epoxy resin 15, and the electrodes 10a/10b are aligned with the conductive layers 11c/11b, respectively. A pressing tool 16 is downwardly moved so as to be brought into contact with the restoring compound layer 13 as shown in FIG. 4B. The pressing tool 16 is further moved downwardly, and causes the electrodes 10a/10b to be sunk into the unconsolidated adhesive epoxy resin 15. The electrodes 10a and 10b are brought into contact with the conductive wirings 11c and 11b, respectively, and are partially crushed. The electrodes 10a and 10b are decreased in thickness from 20 microns to about 17 microns, and make the reverse surface of the semiconductor chip 10 parallel to the major surface of the substrate 11. In this instance, the pressing tool 16 exerts 50 grams to every electrode 10a/10b.

Figure 4C:
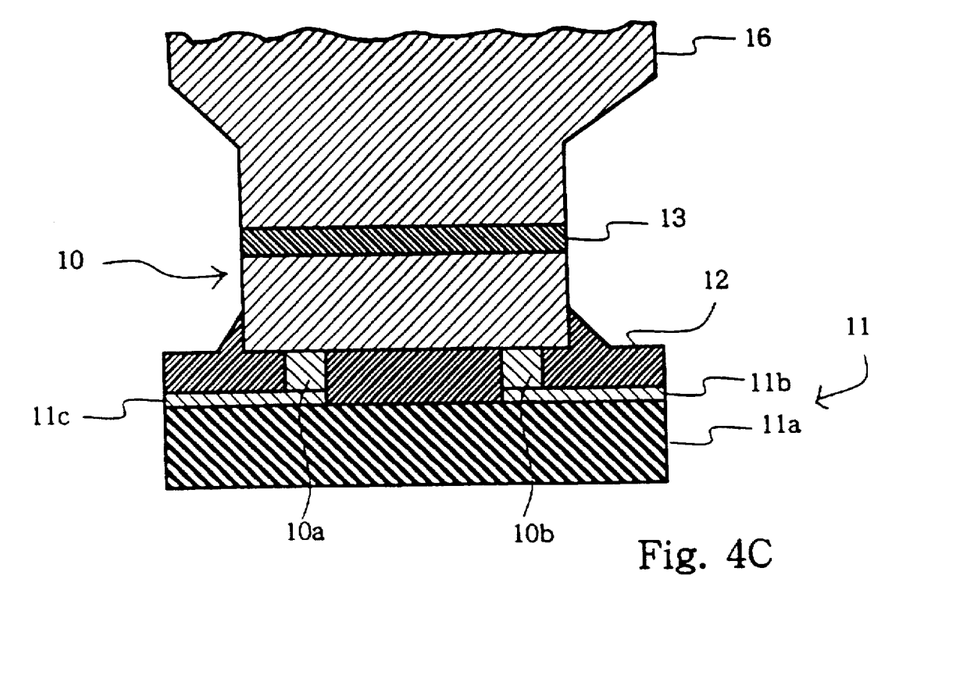

The unconsolidated adhesive epoxy resin 15 is heated to 150 degrees to 220 degrees in centigrade for 5 seconds to 30 seconds. Then, the adhesive epoxy resin 15 is consolidated, and is converted to the adhesive compound layer 12 as shown in FIG. 4C. In this instance, the pressing tool 16 has a built-in heater, and heat is applied from the pressing tool 16 through the restoring compound layer 13 and the semiconductor chip 10 to the unconsolidated adhesive epoxy resin 15. As described hereinbefore, the epoxy resin for the restoring compound layer 13 has the glass transition temperature between 100 degrees and 150 degrees in centigrade, and the restoring compound layer 13 is softened during the heat treatment to the unconsolidated adhesive epoxy resin. Therefore, even if the semiconductor chip 10 has been slightly warped, the warp is removed during the heat treatment.

Figure 4D:
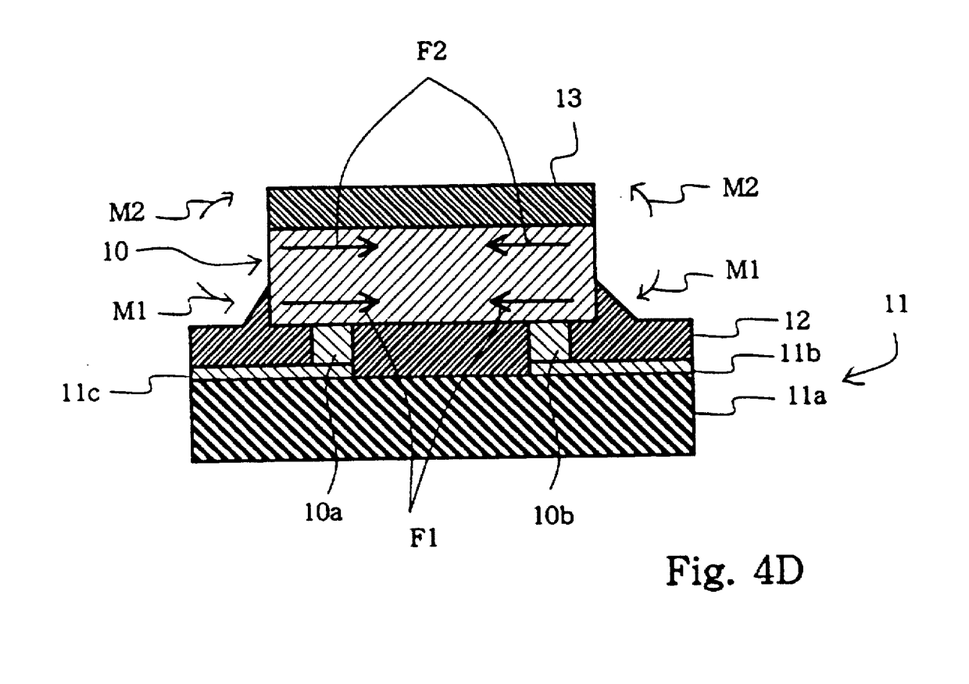

Subsequently, the pressing tool 16 is upwardly moved, and the semiconductor chip 10 is released from the load and the heat. Then, the restoring compound layer 13 is hardened, again, and exerts the force F2 on the upper surface of the semiconductor chip 10. The force F2 produces the counter moment M2, and the counter moment M2 cancels or decreases the moment M1 due to the force F1 exerted on the reverse surface of the semiconductor chip 10 as shown in FIG. 4D.

Thus, the restoring compound layer 13 cancels or decreases the moment M1, and prevents the semiconductor chip 10 from separation from the substrate 11. The magnitude of the force F2 is dependent on the properties and the dimensions of the material for the restoring compound layer 13. If the material for the restoring compound layer 13 has the properties such as thermal expansion coefficient, Young's modulus, Poisson's ratio and so fourth roughly equal to those of the adhesive resin, the forces F1 and F2 are dominated by the thickness of the adhesive compound layer 12 and the thickness of the restoring compound layer 13. For this reason, the restoring compound layer 13 is equal in thickness to the adhesive compound layer 12.

The pressing tool 16 presses the semiconductor chip 10 through the restoring compound layer 13 against the substrate 11. The restoring compound layer 13 is less brittle, and the indirect contact does not break the semiconductor chip 10.

Moreover, the restoring compound layer 13 is softened during the heat treatment. The softened restoring compound layer 13 serves as a cushion, and takes up the load. For this reason, it is not necessary to decrease the load applied from the pressing tool 16. This results in the simple process sequence.

Second Embodiment

Figure 5:
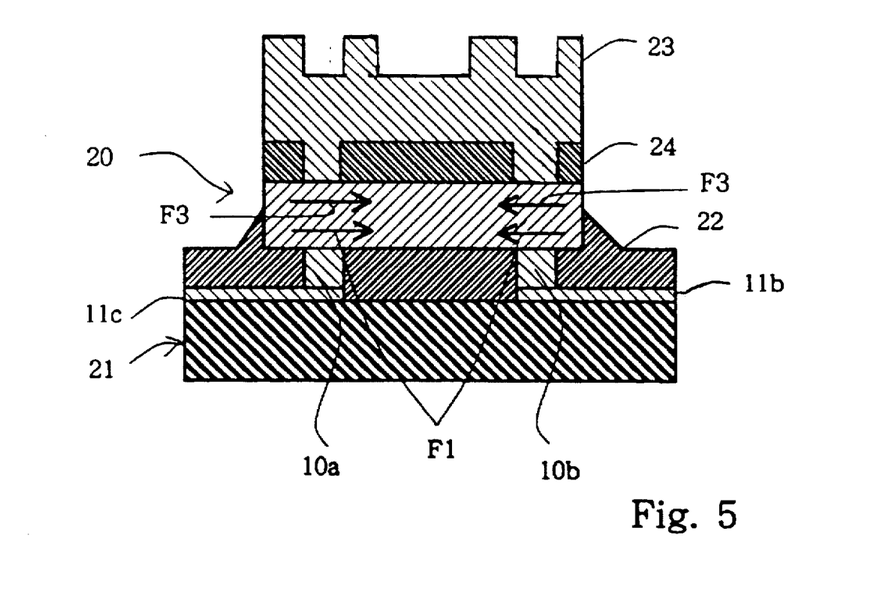
FIG. 5 is a cross sectional view showing the structure of another semiconductor device according to the present invention.

Turning to FIG. 5 of the drawings, another semiconductor device embodying the present invention comprises a semiconductor chip 20, a substrate 21, a lower adhesive compound layer 22, a heat sink 23 and an upper adhesive compound layer 24. Although the semiconductor chip 20 generates heat more than the semiconductor chip 10, the semiconductor chip 20 is similar in structure to the semiconductor chip 10, and no further description is incorporated hereinbefore. The substrate 21 is similar to the substrate 11, and conductive layers of the substrate 21 are labeled with the references designating the corresponding conductive layers of the substrate 11.

The lower adhesive compound layer 22 is similar to the adhesive compound layer 12, and bonds the semiconductor chip 20 to the substrate 21. The upper adhesive compound layer 24 bonds the heat sink 23 to the upper surface of the semiconductor chip 20, and the large amount of heat is radiated from the heat sink 23.

The upper adhesive compound layer 24 serves as the restoring compound layer, and exerts a force F3 corresponding to the force F1 to the upper surface of the semiconductor chip 20. A moment due to the force F3 cancels or decreases the moment due to the force F1, and prevents the semiconductor chip 20 from a separation from the substrate 11.

Figure 6A:
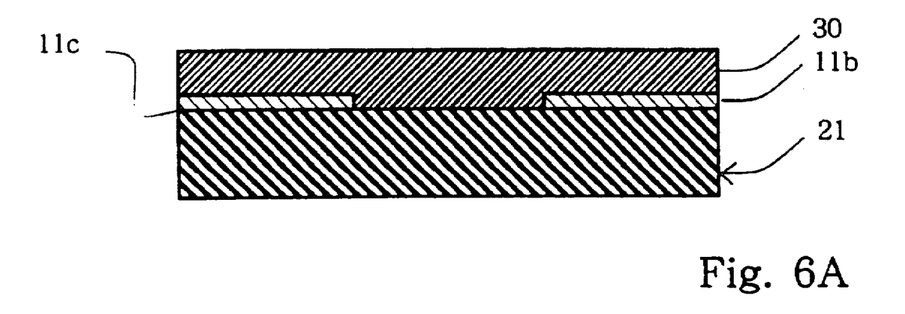
FIGS. 6A to 6E are cross sectional views showing a process sequence for assemblage of the semiconductor device.

The semiconductor device shown in FIG. 5 is fabricated through the following process. The process starts with preparation of the substrate 21, and unconsolidated adhesive compound 30 is spread over the major surface of the substrate 21 as shown in FIG. 6A.

Figure 6B:
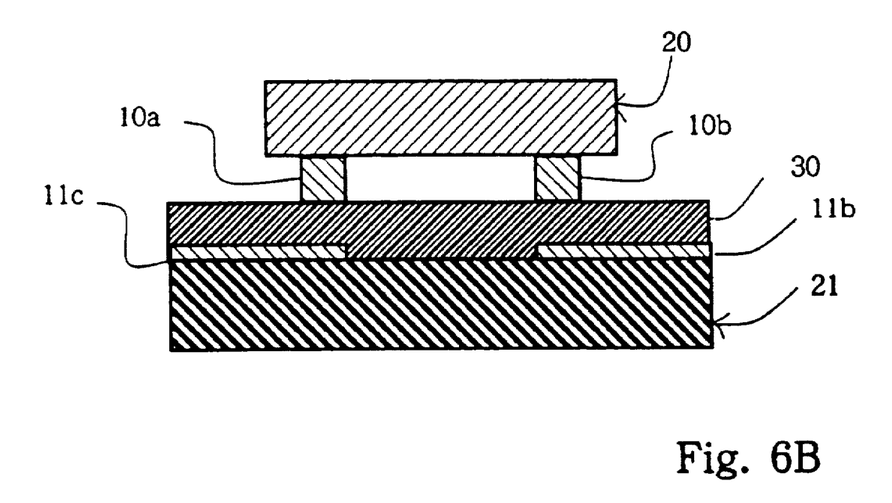

The semiconductor chip 20 is moved onto the unconsolidated adhesive compound layer 30, and the electrodes 10a/10b are aligned with the conductive layers 11c/11b, respectively, as shown in FIG. 6B.

Figure 6C:
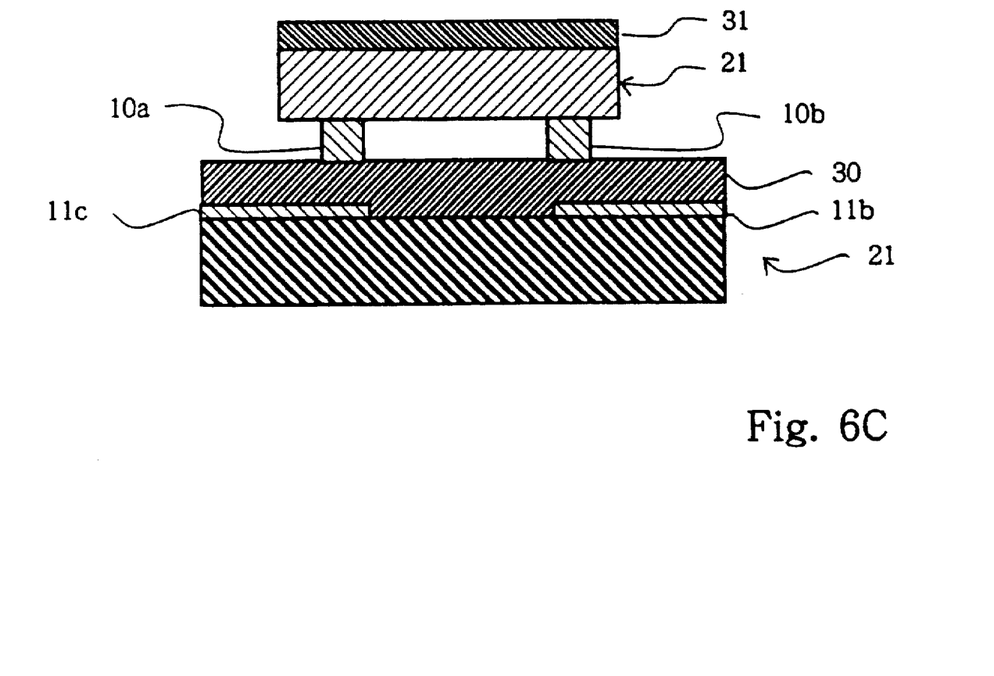

A dispenser (not shown) spreads the unconsolidated adhesive compound over the upper surface of the semiconductor chip 21, and the semiconductor chip 21 is overlain by an unconsolidated adhesive compound layer 31 as shown in FIG. 6C.

Figure 6D:
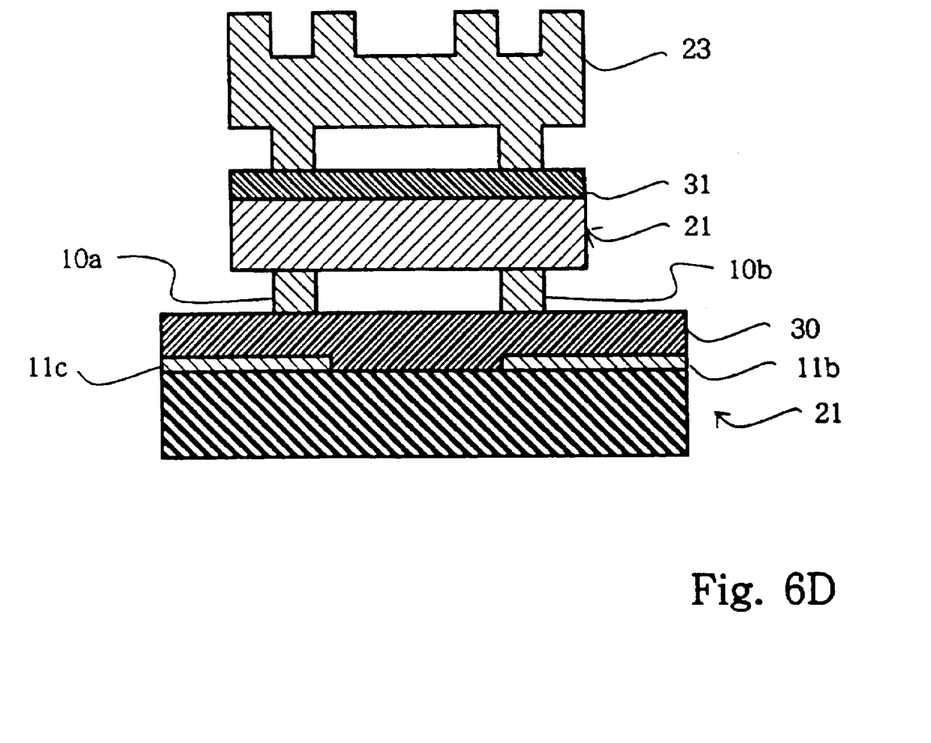

Subsequently, the heat sink 23 is placed on the unconsolidated adhesive compound layer 31 as shown in FIG. 6D.

Figure 6E:
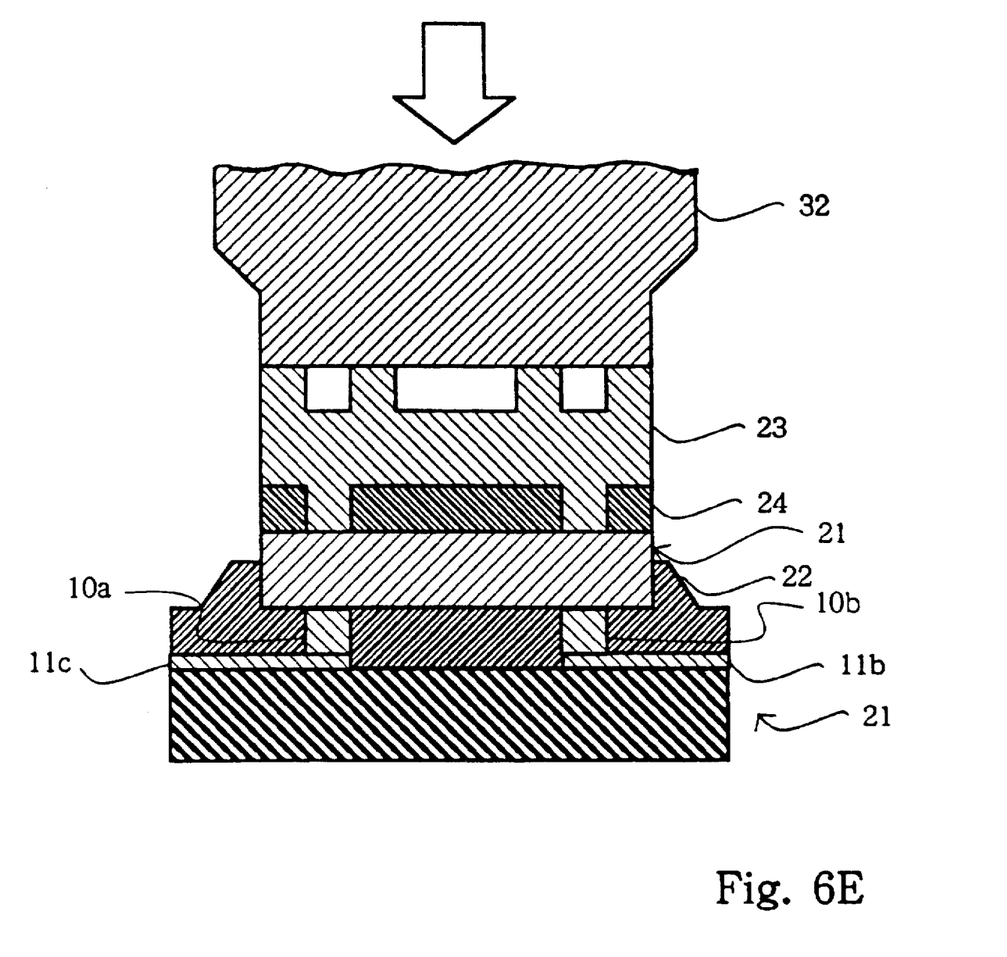

A pressing tool 32 presses the heat sink 23 against the unconsolidated adhesive compound layer 31, and the heat sink 23 is sunk into the unconsolidated adhesive compound layer 31. The heat sink 23 is brought into contact with the upper surface of the semiconductor chip 21, and presses the semiconductor chip 21 against the unconsolidated adhesive compound layer 30. The electrodes 10a and 10b are sunk into the unconsolidated adhesive compound layer 30, and are brought into contact with the conductive layers 11c and 11b, respectively. The tool heats the unconsolidated adhesive compound layers 30 and 31, and converts the unconsolidated adhesive compound layers 30 and 31 into the lower adhesive compound layer 22 and the upper adhesive compound layer 24, respectively. As a result, the conductive wirings 11b/11c are electrically connected through the electrodes 10b and 10a, respectively, and the heat sink 32 is thermally connected to the semiconductor chip 21.

The semiconductor device implementing the second embodiment achieves all the advantages of the first embodiment.

Although particular embodiments of the present invention have been shown and described, it will be obvious to those skilled in the art that various changes and modifications may be made without departing from the spirit and scope of the present invention.

For example, the electric component may be a discrete semiconductor device or a passive element such as a capacitor.

Moreover, the adhesive compound and the material for the restoring compound layer may be in the acrylic compound system.

The adhesive compound and the material for the restoring compound layer may be consolidated in a radiation of light.

What is claimed is:

1. A semiconductor device comprising:
   a substrate including an insulating plate having a first surface and at least one conductive wiring formed on said first surface of said insulating plate;

an electric circuit component having a first surface, a second surface opposite to said first surface and at least one electrode formed on said first surface and held in contact with said at least one conductive wiring;

a consolidated adhesive compound provided between said first surface of said substrate and said first surface of said electric circuit component so as to bond said electric circuit component to said substrate, and exerting a first force to said first surface of said electric circuit component due to a shrinkage during a consolidation; and a restoring compound layer provided on said second surface of said electric circuit component so as to exert a second force on said second surface of said electric component due to a shrinkage thereof, thereby reducing a moment due to said first force exerted on said first surface of said electric circuit component.

2. The semiconductor device as set forth in claim 1, in which said consolidated adhesive compound and the compound for said restoring compound layer are synthetic resin in epoxy system.

3. The semiconductor device as set forth in claim 1, in which said synthetic resin is consolidated under application of heat.

4. The semiconductor device as set forth in claim 1, in which said consolidated adhesive compound and the compound for said restoring compound layer are synthetic resin in epoxy system, and are roughly equal in thickness to each other.

5. The semiconductor device as set forth in claim 1, further comprising a heat sink held in contact with said second surface of said electric circuit component and bonded to said electric circuit component by means of said restoring compound layer.

6. The semiconductor device as set forth in claim 1, wherein said consolidated adhesive compound is composed of a material different from that of said restoring compound layer.

7. The semiconductor device as set forth in claim 1, wherein said restoring compound layer is configured to produce a second force which eliminates said moment due to said first force.

8. A semiconductor device comprising:

a substrate including an insulating plate having a first surface and at least one conductive wiring formed on said first surface of said insulating plate;

an electric circuit component having a first surface, a second surface opposite to said first surface and at least one electrode formed on said first surface and held in contact with said at least one conductive wiring;

a consolidated adhesive compound provided between said first surface of said substrate and said first surface of said electric circuit component so as to bond said electric circuit component to said substrate, and exerting a first force to said first surface of said electric circuit component due to a shrinkage during a consolidation;

a restoring compound layer provided on said second surface of said electric circuit component so as to exert a second force on said second surface of said electric component due to a shrinkage thereof, thereby reducing a moment due to said first force exerted on said first surface of said electric circuit component; and a heat sink held in contact with said second surface of said electric circuit component and bonded to said electric circuit component by means of said restoring compound layer.

9. A semiconductor device comprising:

an electric circuit component having a first surface, a second surface opposite to said first surface, and at least one electrode on either said first or said second surface;

a consolidated adhesive compound provided on said first surface of said electric circuit component, wherein said adhesive exerts a first force on said first surface of said electric circuit component due to shrinkage during consolidation; and a discrete restoring compound layer provided on said second surface of said electric circuit component so as to exert a second force on said second surface of said electric component due to shrinkage thereof, thereby reducing a moment due to said first force exerted on said first surface of said electric circuit component.

10. The semiconductor device as set forth in claim 9, further comprising a substrate including an insulating plate, wherein a first surface of said substrate is connected to said electric circuit component by said consolidated adhesive compound.

11. The semiconductor device as set forth in claim 10, further comprising at least one conductive wiring formed on said first surface of said insulating plate.

12. The semiconductor device as set forth in claim 11, wherein said at least one electrode is on said first surface of said electric circuit component and contacts said at least one conductive wiring.

13. The semiconductor device as set forth in claim 9, wherein the thickness of said consolidated adhesive compound and the thickness of the restoring compound layer are substantially equal.

14. The semiconductor device as set forth in claim 9, further comprising a heat sink held in contact with said electric circuit component by said restoring compound layer.

15. A semiconductor device comprising:

a substrate including an insulating plate having a first surface and at least one conductive wiring formed on said first surface of said insulating plate;

an electric circuit component having a first surface, a second surface opposite to said first surface and at least one electrode formed on said first surface and held in contact with said at least one conductive wiring;

a consolidated adhesive compound contacting said first surface of said substrate and said first surface of said electric circuit component so as to bond said electric circuit component to said substrate, wherein said adhesive compound exerts a first force to said first surface of said electric circuit component due to shrinkage during consolidation; and a restoring compound layer provided on said second surface of said electric circuit component so as to exert a second force on said second surface of said electric component due to shrinkage thereof, thereby reducing a moment due to said first force exerted on said first surface of said electric circuit component.

* * * * *